United States Patent [19] | [11] Patent Number: 4,724,403
Takayama | [45] Date of Patent: Feb. 9, 1988

[54] MICROWAVE OSCILLATOR

[75] Inventor: Akira Takayama, Soma, Japan

[73] Assignee: Alps Electric Co., Japan

[21] Appl. No.: 855,185

[22] Filed: Apr. 23, 1986

[30] Foreign Application Priority Data

Apr. 23, 1985 [JP] Japan .................................. 60-86935

[51] Int. Cl.[4] .......................... H03B 5/18; H03B 7/14; H01P 7/10

[52] U.S. Cl. .................................. 331/96; 331/117 D; 333/222; 333/224

[58] Field of Search .............. 331/96, 107 DP, 117 D, 331/101, 107 C; 333/219, 227, 231, 232, 235, 222-226

[56] References Cited

U.S. PATENT DOCUMENTS 4,019,161 4/1977 Kimura et al. .................... 331/96 X
4,613,838 9/1986 Wada et al. .......................... 333/232

FOREIGN PATENT DOCUMENTS 1199908 7/1970 United Kingdom ................ 333/231

*Primary Examiner*—Eugene R. LaRoche
*Assistant Examiner*—David Mis
*Attorney, Agent, or Firm*—Guy W. Shoup

[57] ABSTRACT

A microwave oscillator of the type in which a dielectric resonator is disposed inside a conductive housing, characterized in that a conductive rod-like member is disposed inside the housing and arranged in parallel with the axis of the dielectric resonator with one end connected electrically to the housing and the other end left free. Preferrably, the rod-like member is made so thin as to interrupt little the magnetic flux generated by the dielectric resonator, and the resonance frequency of the housing is selected lower than that of the dielectric resonator.

4 Claims, 10 Drawing Figures

MICROWAVE OSCILLATOR

BACKGROUND OF THE INVENTION

1. Field of the Invention

This invention relates to a microwave oscillator of the type in which a dielectric resonator is disposed inside a conductive housing.

2. Description of the Prior Art

Hitherto, the microwave oscillator composed of a dielectric resonator is widely used as the oscillator for generating frequencies of the microwave band. For reference, an example of the conventional microwave oscillator is shown in FIG. 4 in vertical sectional view. In FIG. 4, a microwave oscillator 1 is configured so that on the bottom of a metal frame 2 whose one face is opened a circuit substrate 3 is arranged, on this circuit substrate 3 a dielectric resonator 4 is arranged, and an electric circuit not shown is also provided which comprises active elements such as transistors and passive elements, such as resistors and condensers. To the open face of the metal frame 2 a metal cover 5 is attached to close the same. On the metal cover 5 a conductive adjustable screw 6 is mounted which is positioned coaxially with respect to the dielectric resonator 4 and adjustable so as to approach and separate from the dielectric resonator 4. By the metal frame 2 and metal cover 5 a conductive housing 7 is made up.

In the foregoing configuration, as the adjustable screw 6 is so adjusted as to approach or separate from the dielectric resonator 4, the resonance frequency of the dielectric resonator 4 is adjusted, so that the adjusted resonance frequency is selected and amplified by the electric circuit provided on the circuit substrate 3 and the selected oscillation frequency is output from the microwave oscillator 1. By means of the housing 7 undesirable emission of oscillation energy from the dielectric resonator 4 is prevented.

According to such a configuration, the dielectric resonator 4 produces an electric field E distributed about its axis as shown in FIG. 5 and a magnetic flux Φ passing in the axial direction thereof as shown in FIG. 6. Thus, as the adjustable screw 6 is adjusted and moved, the amount of magnetic flux Φ generated by the dielectric resonator 4 and interrupted by the adjustable screw 6 varies, as shown in FIG. 7 and the resonance frequency of the dielectric resonator 4 changes. If the adjustable screw 6 is so adjusted as to approach the dielectric resonator 4, for example, the resonance frequency of the dielectric resonator 4 becomes high.

In addition, the conductive housing 7 made up of the metal frame 2 and metal cover 5 forms a cavity resonator inside which an electric field E and magnetic field H are distributed as shown in FIG. 8. As the adjustable screw 6 is inserted into the electric field E, as shown in FIG. 9, a part of the electric field E is interrupted and the resonance frequency becomes low. Obviously, the resonance frequency of the cavity resonator formed by the housing 7 is determined by the shape and size of the housing 7, and the smaller the size, the higher the resonance frequency becomes.

Because the dielectric resonator 4 is stored in the housing 7, its Q suffers an influence of the housing 7, thereby becoming low. Therefore, in the prior art, the size of the sides of the housing 7 is selected larger than about two times the diameter of the dielectrc resonator 4 and the electric circuit provided on the circuit substrate 3 is designed so as to compensate for a decrease of Q; thus, it was impossible to miniaturize the microwave oscillator 1 to a great extent.

However, miniaturization of such equipments is strongly desired recently. In view of such a demand, if the microwave oscillator 1 of the conventional configuration were miniaturized further, a decrease of Q may be compensated for by the electric circuit provided on the circuit substrate 3; but, there arises the serious problem that the oscillation frequency of the microwave oscillator 1 becomes unstable.

The foregoing problem will now be described. As the housing 7 is made small in size, the resonance frequency of the housing 7 becomes high and sometimes exceeds the resonance frequency of the dielectric resonator 4. In such a case, as will become apparent from a return loss-frequency characteristic obtained when viewed the conventional microwave oscillator from its output terminal, as shown in FIG. 10, if the adjustable screw 6 is so adjusted as to approach the dielectric resonator 4, the resonance frequency of the housing 7 becomes low and contrarily, the resonance frequency of the dielectric resonator 4 becomes high; thus, there arises the state in which the resonance frequency of the housing 7 is identical substantially to that of the dielectric resonator 4. As a result, the respective resonance frequencies of the housing 7 and dielectric resonator 4 are amplified and output simultaneously by the electric circuit provided on the circuit substrate 3, whereby the two oscillation frequencies are output from the microwave oscillator 1. For reference, in FIG. 10, symbol A indicates the resonance frequency of the dielectric resonator 4 when the adjustable screw 6 is spaced sufficiently from the dielectric resonator 4 and B indicates the resonance frequency of the housing 7 in the above state, whereas symbol A′ indicates the resonance frequency of the dielectric resonator 4 when the adjustable screw 6 is positioned close to the dielectric resonator 4 and B′ indicates the resonance frequency of the housing 7 in this second state.

SUMMARY OF THE INVENTION

The present invention has been devised to solve the foregoing problem of the conventional microwave oscillator, and its general object is to provide a microwave oscillator which can output a stable oscillation frequency and can be miniaturized, characterized in that the resonance frequency of a housing is selected lower than the resonance frequency of a dielectric resonator, whereby the resonance frequency of the housing does not becomes identical to that of the dielectric resonator even if an oscillation frequency is adjusted.

To achieve the foregoing object, a microwave oscillator according to the present invention is of the type in which a dielectric resonator is disposed inside a conductive housing, and characterized in that a conductive rod-like member is disposed inside the housing and arranged in parallel with the axis of the dielectric resonator with one end connected electrically to the housing and the other end left free.

According to the present invention, since the conductive thin rod-like member is disposed inside the housing and arranged in parallel with the axis of the dielectric resonator with one end connected electrically to the housing and the other end left free, the resonance frequency of the housing can be made low without giving any influence to the resonance frequency of the dielectric resonator, and the resonance frequency of the dielectric resonator does not become identical to that of the housing even if its oscillation frequency is adjusted. Therefore, the microwave oscillator according to the present invention can output a stable oscillation frequency and can be miniaturized to a greater extent.

DESCRIPTION OF THE PREFERRED EMBODIMENT

Figure 1:
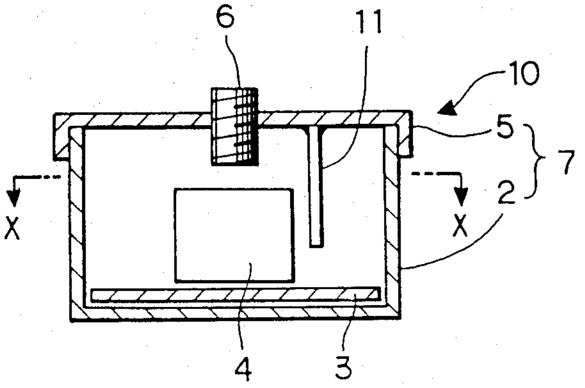
FIG. 1 is a vertical sectional view showing an embodiment of a microwave oscillator according to the present invention.
Figure 2:
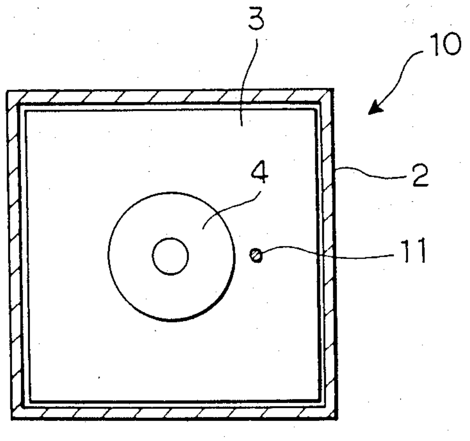
FIG. 2 is a sectional view taken along line X—X of FIG. 1.

An embodiment of a microwave oscillator according to the present invention will now be described with reference to FIGS. 1 and 2. FIG. 1 is the vertical sectional view showing the embodiment of the microwave oscillator according to the present invention and FIG. 2 is the sectional view taken along line X—X of FIG. 1. In FIGS. 1 and 2, members identical to those shown in FIG. 4 are indicated by the same reference numerals as those with their description omitted.

Figure 4:
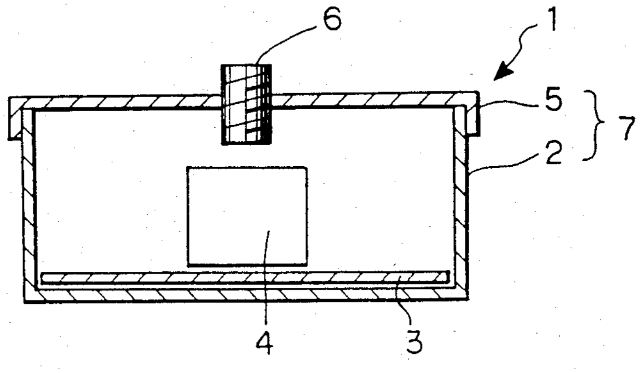
FIG. 4 PRIOR ART
FIG. 4 is a vertical sectional view showing an example of the conventional microwave oscillator.
Figure 5:
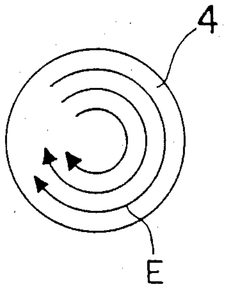
FIG. 5 is a diagram showing an electric field distributed about the axis of a dielectric resonator.
Figure 6:
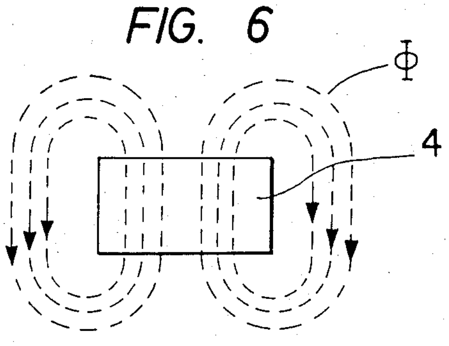
FIG. 6 is a diagram showing a magnetic flux passing along the axial direction of the dielectric resonator.
Figure 7:
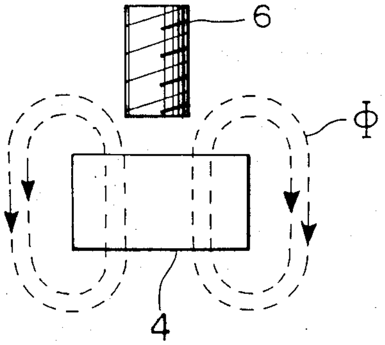
FIG. 7 is a diagram illustrating the circumstances that the amount of the magnetic flux generated by the dielectric resonator and interrupted by an adjustable screw varies in response to adjustment and movement of the adjustable screw.
Figure 8:
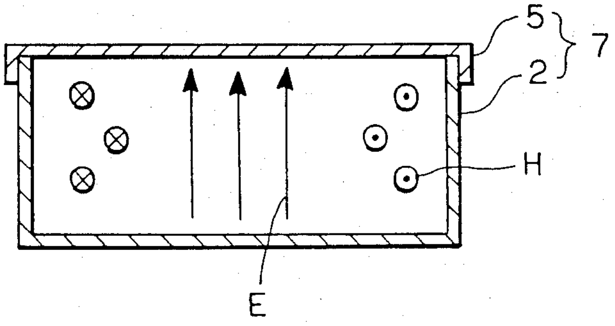
FIG. 8 is a diagram showing the electric field and magnetic field distributed inside a housing.
Figure 9:
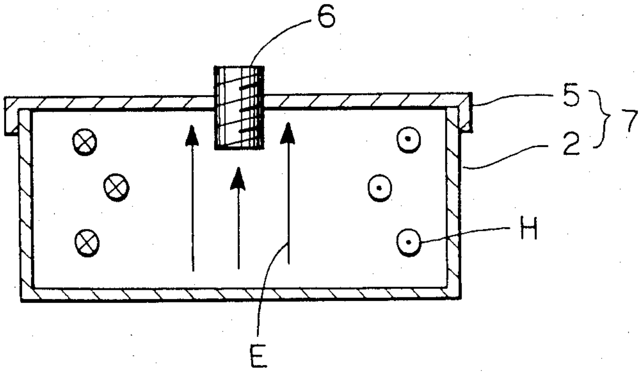
FIG. 9 is a diagram illustrating the circumstances that the amount of the electric field distributed inside the housing and interrupted by the adjustable screw varies in response to insertion of the adjustable screw.

The different point of a microwave oscillator 10 according to the present invention shown in FIGS. 1 and 2 from the conventional microwave oscillator 1 shown in FIG. 4 is that a conductive thin rod-like member 11 is disposed inside the housing 7 and arranged in parallel with the axis of the dielectric resonator 4 with one end connected electrically to the metal cover 5 forming a part of the housing 7 and the other end left free.

Figure 3:
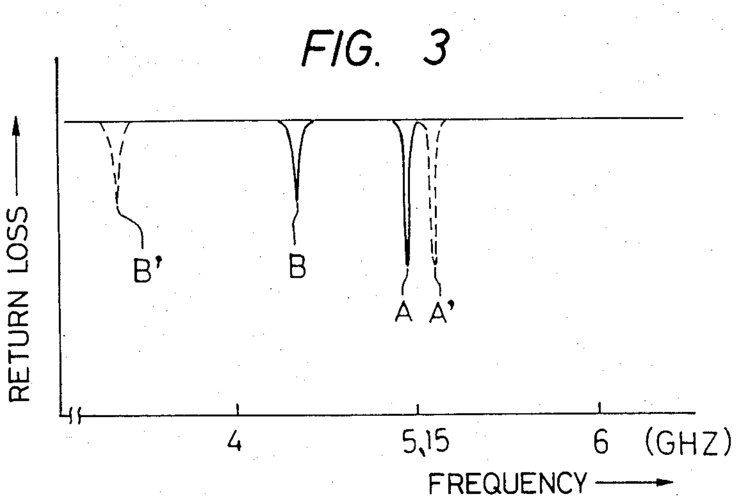
FIG. 3 is a graph showing a return loss-frequency characteristic obtained when viewed the microwave oscillator according to the present invention from its output terminal.
Figure 10:
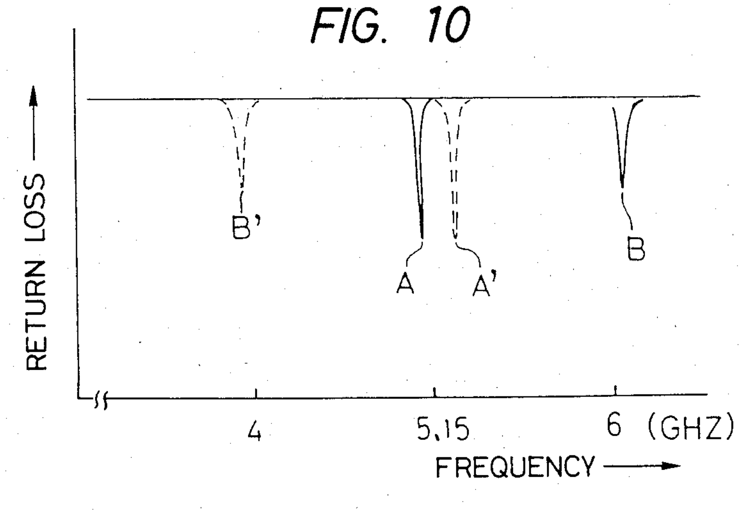
FIG. 10 is a graph showing a return loss-frequency characteristic obtained when viewed the conventional microwave oscillator from its output terminal.

In the foregoing configuration, the resonance frequency of the housing 7 becomes low due to the presence of the rod-like member 11, analogous to the adjustable screw 6 being made to approach the dielectric resonator 4. However, because this rod-like member 11 is thin, it interrupts slightly the magnetic flux Φ generated by the dielectric resonator 4 and influences little the resonance frequency of the dielectric resonator 4. Therefore, as is apparent from the return loss-frequency characteristic obtained when viewed the microwave oscillator of the present invention from its output terminal, shown in FIG. 3, when the adjustable screw 6 is spaced sufficiently from the dielectric resonator 4 the resonance frequency A of the dielectric resonator 4 is higher than the resonance frequency B of the housing 7, and even when the adjustable screw 6 is made close to the dielectric resonator 4, the resonance frequency A' of the dielectric resonator 4 does not become identical to the resonance frequency B' of the housing 7. Accordingly, the electric circuit provided on the circuit substrate 3 amplifies and outputs the resonance frequency of the dielectric resonator 4 only, and the microwave oscillator 10 can output the stable oscillation frequency. Further, the microwave oscillator 10 can provide stably its oscillation frequency and can be miniaturized.

As described hereinabove, since the microwave oscillator according to the present invention is characterized by the conductive thin rod-like member disposed inside the housing and arranged in parallel with the axis of the dielectric resonator with one end connected electrically to the housing and the other end left free, this rod-like member can make low the resonance frequency of the housing without giving any influence to the resonance frequency of the dielectric resonator, and the resonance frequency of the dielectric resonator does not become identical to that of the housing even if the oscillation frequency is adjusted. Accordingly, the present invention produces the effect that the microwave oscillator can output the stable oscillation frequency and can be miniaturized to a greater extent.

What is claimed is:

1. A microwave oscillator comprising:

an enclosed conductive housing including a lower wall, side walls, and an upper wall and having a characteristic as a cavity resonator of an adjustable resonance frequency;

a dielectric resonator of a cylindrical shape disposed axially upright in the conductive housing with its lower end not in contact with the lower wall of the housing, its sides spaced from the side walls of the housing, and its upper end spaced a given distance from the upper wall of the housing, and having a characteristic of an adjustable resonance frequency;

an adjusting screw provided through the upper wall of the housing with its axis in a common line with the axis of the dielectric resonator and having its lower end movable toward and away from the dielectric resonator, wherein as the screw end is moved toward the dielectric resonator, the resonance frequency of the dielectric resonator becomes higher, and the resonance frequency of the housing becomes lower; and a conductive thin, elongated rod-like member secured at one end in conductive contact to the upper wall of the housing and extended downwardly in the space between a side of the dieletric resonator and a side wall of the housing parallel to the axis of the dieletric resonator with its free end not in contact with either the dielectric resonator or the walls of the housing, wherein the rod-like member has the effect of lowering an initial resonance frequency of the housing below an initial resonance frequency of the dielectric resonator such that an adjusted resonance frequency of the housing does not at any point become equal to an adjusted resonance frequency of the dielectric resonator when the adjusting screw is moved toward the dielectric resonator.

2. A microwave oscillator according to claim 1, wherein said rod-like member is sufficiently thin so as to interrupt little the magnetic flux generated by said dielectric resonator.

3. A microwave oscillator according to claim 1, wherein the resonance frequency of said housing is selected lower than the resonance frequency of said dielectric resonator.

4. A microwave oscillator according to claim 1, wherein said housing is composed of a metal frame with its one face opened being covered by a metal cover, and said rod-like member is attached to said cover.

* * * * *